(12) United States Patent
Krupnik et al.

(10) Patent No.: US 6,566,915 B1
(45) Date of Patent: May 20, 2003

(54) DIFFERENTIAL ENVELOPE DETECTOR

(75) Inventors: Yoel Krupnik, Jerusalem (IL); Lior Horwitz, Nirit (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/636,307

(22) Filed: Aug. 10, 2000

(51) Int. Cl.[7] ............................................... H03K 5/153
(52) U.S. Cl. .............................. 327/58; 327/54; 327/62
(58) Field of Search ............................. 327/51, 52, 54, 327/58, 62, 330, 59, 96; 330/252, 253, 260, 271, 282, 293, 9, 69

(56) References Cited

U.S. PATENT DOCUMENTS

| 5,206,602 A | * | 4/1993 | Baumgartner et al. | .......... 330/9 |
| 5,982,232 A | * | 11/1999 | Rogers | .......... 330/69 |
| 6,011,435 A | * | 1/2000 | Takeyabu et al. | ........... 330/252 |

* cited by examiner

Primary Examiner—Tuan T. Lam
Assistant Examiner—Hiep Nguyen
(74) Attorney, Agent, or Firm—Seth Z. Kalson

(57) ABSTRACT

A differential envelope detector for detecting the envelope of a received differential signal. The received differential signal comprises first and second received voltages, and the differential envelope detector provides a differential output voltage comprising first and second output voltages, where the difference of the first and second output voltages is indicative of the envelope of the difference of the first and second received voltages. For full-wave rectification, the first received voltage is coupled to the non-inverting input port of a first differential amplifier and the inverting input port of a second differential amplifier, and the second received voltage is coupled to the inverting input port of the first differential amplifier and the non-inverting input port of the second differential amplifier. The output ports of the differential amplifiers are coupled to their input ports to provide negative feedback. The output ports of the differential amplifiers source and sink small-signal current to and from capacitors, where the voltage potential of the capacitors provides the first and second output voltages.

13 Claims, 7 Drawing Sheets

DIFFERENTIAL ENVELOPE DETECTOR

FIELD

The present invention relates to analog circuits, and more particularly, to envelope detectors.

BACKGROUND

The Home Phoneline Networking Alliance (HomePNA) is an incorporated, non-profit association of companies working to bring networking technology to the home. See www.homepna.org. HomePNA envisions bringing Ethernet technology to the home by utilizing existing home phone wiring for the network physical medium. HomePNA provides specifications for the physical layer (PHY), its interface to an Ethernet MAC (Media Access Control), and its interface to the home phone wiring. See the IEEE (Institute of Electrical and Electronic Engineers) 802.3 standard for Ethernet.

The position of a HomePNA PHY in relationship to the OSI (Open Systems Interconnection) model is illustrated in FIG. 1. Logical Link Control (LLC) 102 and MAC 104 are implemented in accordance with IEEE 802.3, and Home-PNA PHY 106 communicates with MAC 104 via interface 108. Additional sublayers, and other optional layers, may be added to the layers shown in FIG. 1 so that PHY 106 may provide services to other communication protocols, such as Gigabit Ethernet. In practice, PHY 106 and MAC 104 may be integrated on a single die, so that interface 108 is not readily visible.

PHY 106 receives a MAC frame from MAC 104, strips off the 8 octets of preamble and delimiter from the MAC frame, adds a HomePNA PHY header to form a HomePNA PHY frame, and transmits the PHY frame on physical medium 108. A PHY frame is transmitted on physical medium 108 utilizing pulse position modulation (PPM). All PHY symbols transmitted on physical medium 108 comprise a pulse formed of an integer number of cycles of a square wave that has been filtered with a bandpass filter. The position of the pulse conveys the transmitted symbol. Differential signaling is employed, in which a pulse and its negative are transmitted on two wires for each transmitted symbol.

FIG. 2 illustrates an example of received waveforms. Although differential signaling is employed, for simplicity FIG. 2 shows only a single-ended version of the received differential signal. Each symbol is 129 tics long, where 1 tic is defined as $(7/60)10^{-6}$ seconds, which is approximately 116.667 nanoseconds. Pulses are positioned within one of four time slots to convey two bits of information. The time slots are separated by 20 tics, and are at positions 66, 86, 106, and 126 tics from the beginning of a symbol interval. A special SYNC symbol, indicated as AID (Access Identification) symbol 0 in FIG. 2, is composed of a SYNC_START pulse beginning at tic=0 and a SYNC_END pulse beginning at tic=126. In FIG. 2, AID symbol 1 comprises a pulse in position 1 (tic=86), and AID symbol 2 comprises a pulse at position 2 (tic=106). A receiving PHY performs full-wave rectification of the received signals, and compares the envelope of the rectified signals with an AID slice threshold. The PHY detects a received pulse if its envelope exceeds the AID slice threshold. As soon as a pulse is detected by a PHY, the PHY disables further indications of detection until a time AID_END_BLANK (located at tic=61) from the beginning of the pulse, after which detection indication must be re-enabled for the next received pulse.

One approach for detecting the envelope of a differential signal is to form the difference of the received differential signals to provide a single-ended signal, followed by detecting the envelope of the single-ended signal. One such envelope detector is shown in FIG. 3. A single-ended voltage signal V is applied to non-inverting port 302 of differential amplifier 304 and to inverting port 306 of differential amplifier 308. Diodes 310 and 312 provide full-wave rectification, so that capacitor 314 charges when either diode 310 or diode 312 is forward biased. The output voltage $V_{out}$ at node 316 is proportional to the envelope of the input signal V. Resistor 318 allows capacitor 314 to discharge when there is no received signal.

The present invention improves upon the envelope detector of FIG. 3 for networks employing differential signaling.

DESCRIPTION OF THE EMBODIMENTS

Figure 1:
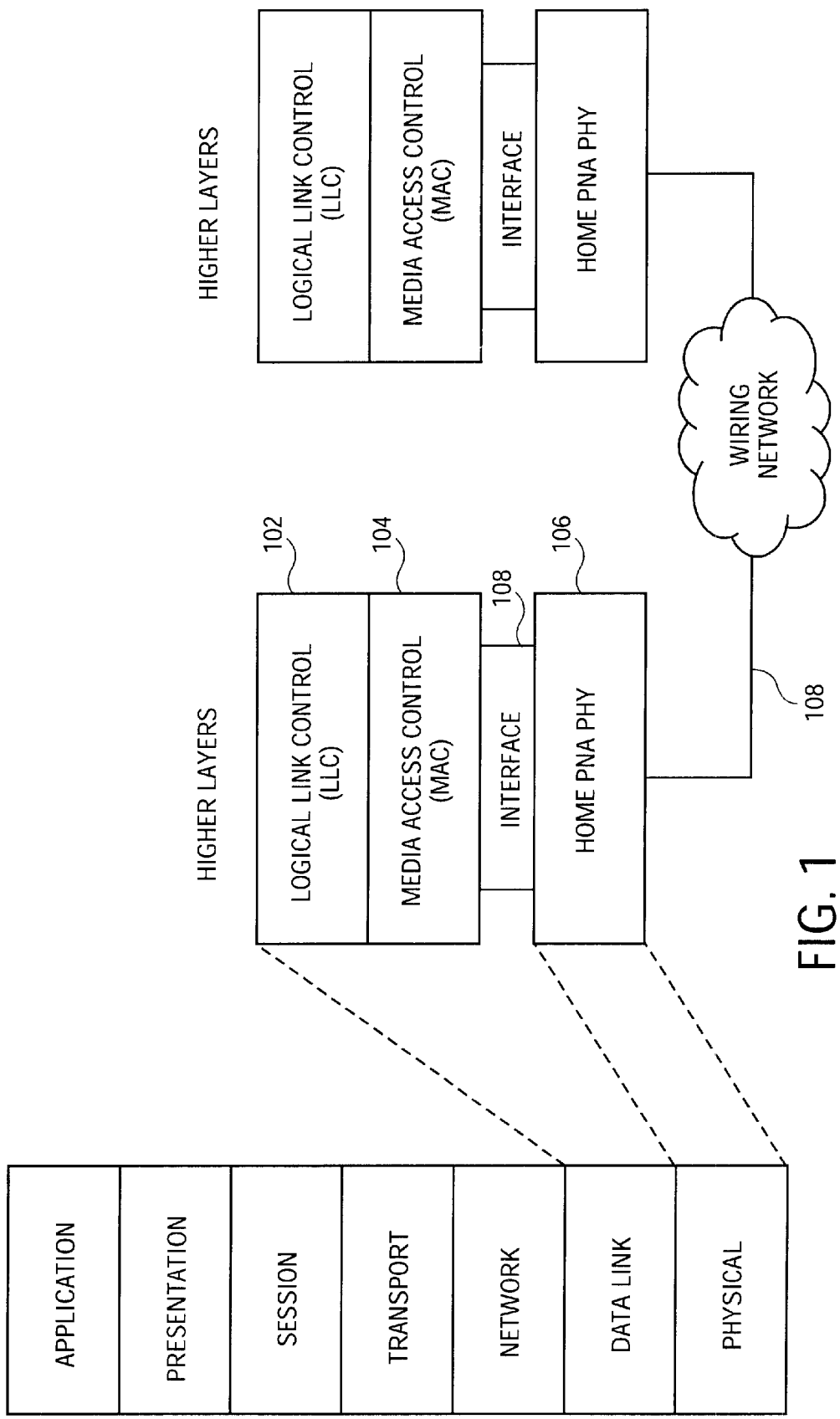
FIG. 1 illustrates a protocol stack for a HomePNA network.
Figure 2:
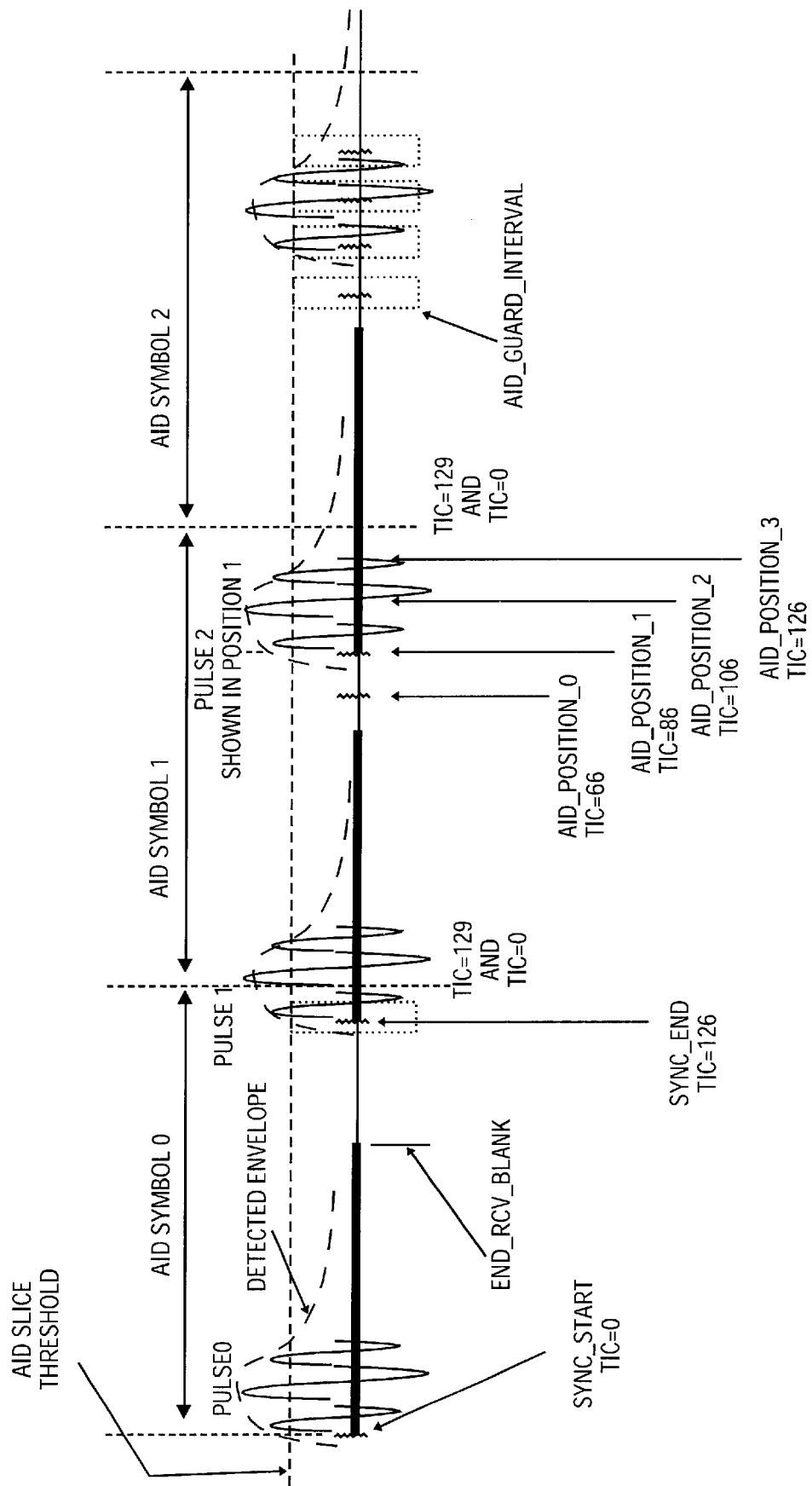
FIG. 2 illustrates an example of received waveforms for a HomePNA network.
Figure 3:
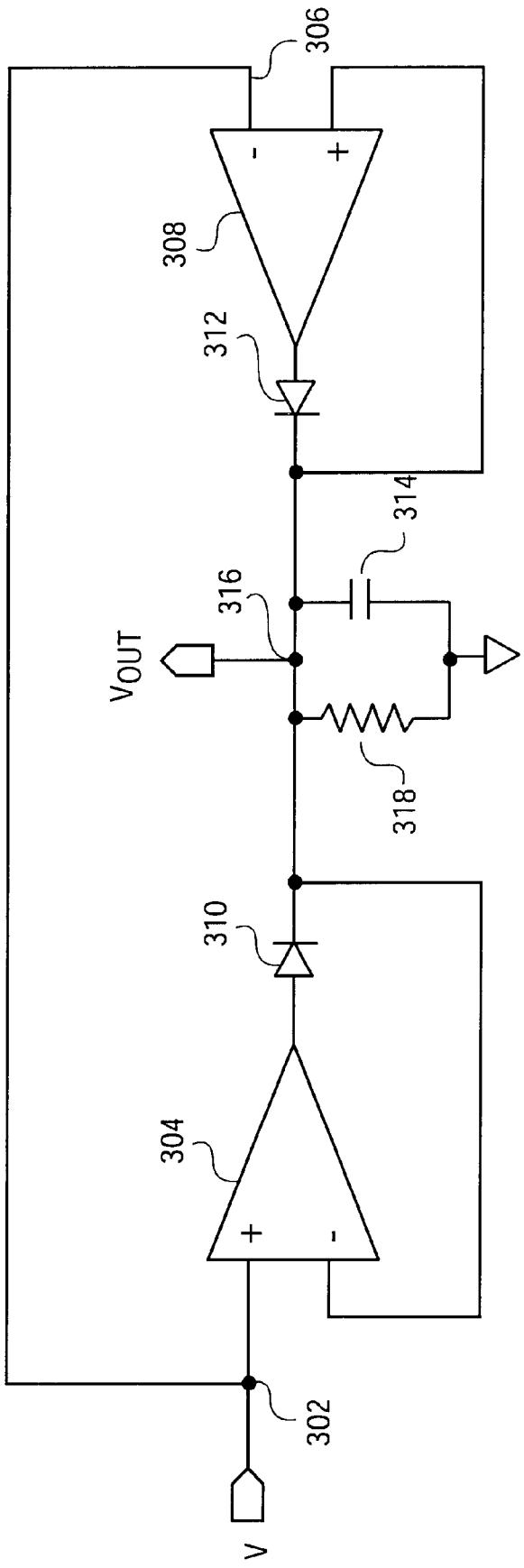
FIG. 3 is a circuit for prior art envelope detector.
Figure 4:
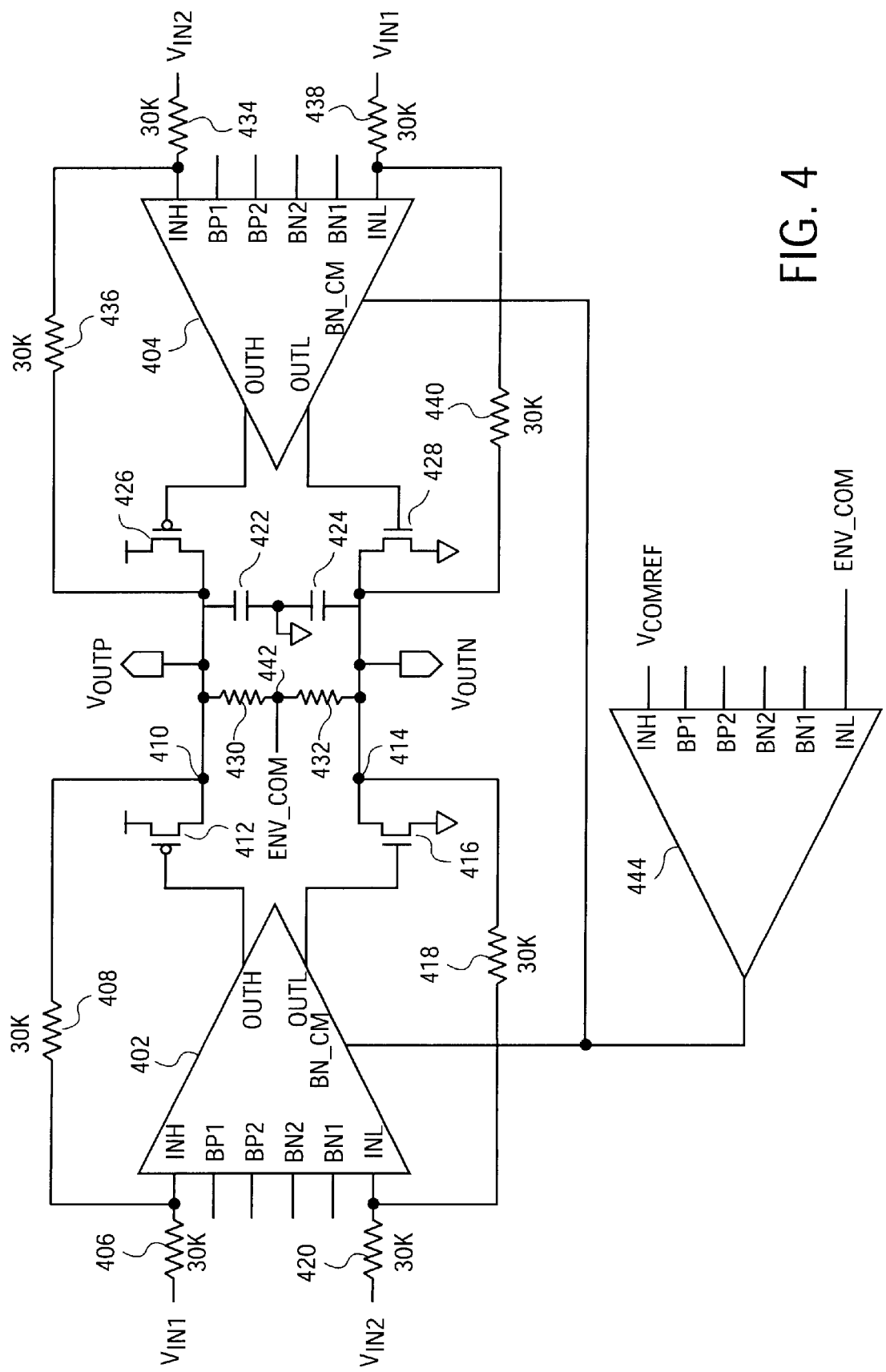
FIG. 4 is a circuit according to an embodiment of the present invention.
Figure 5:
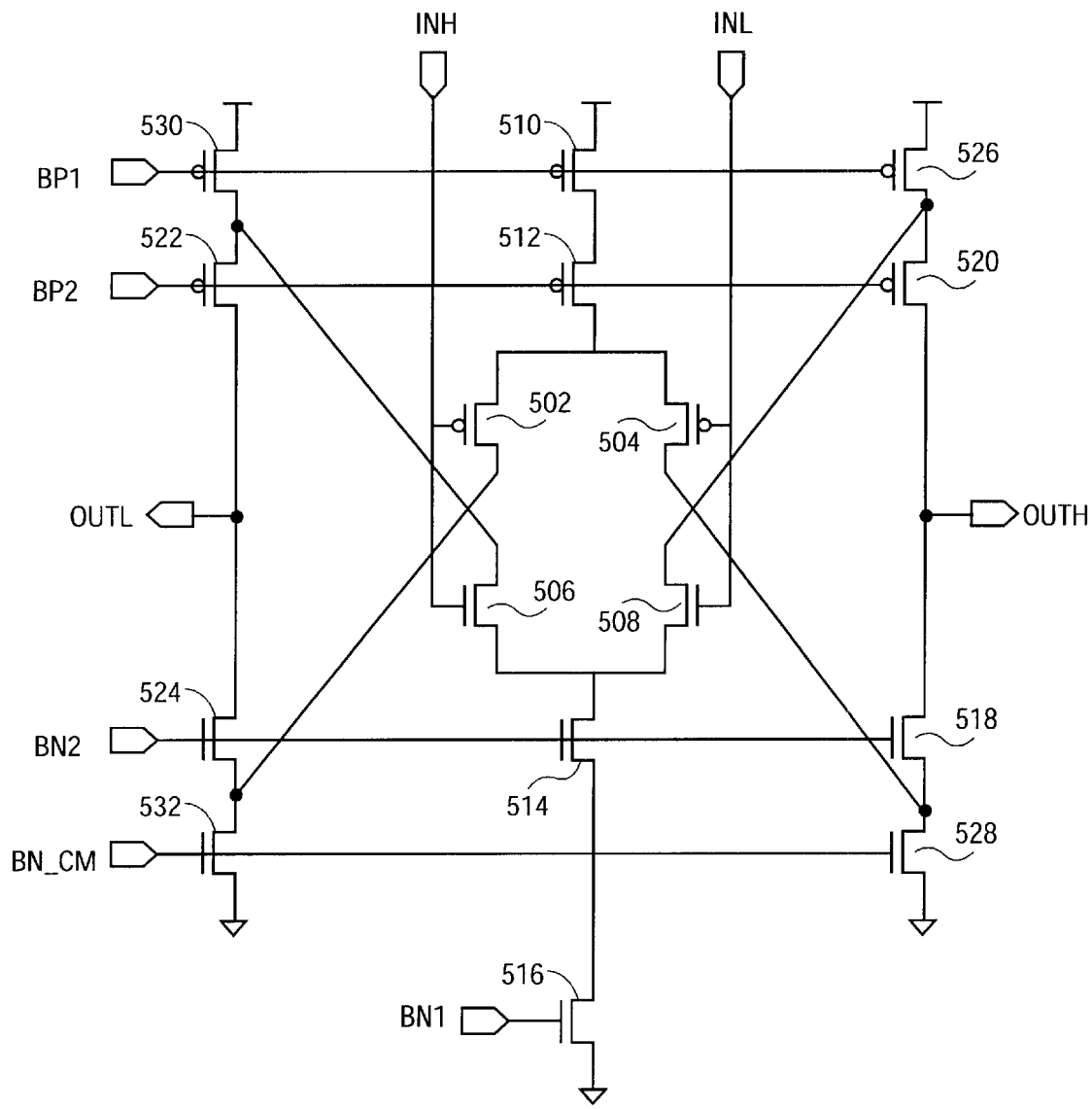
FIG. 5 is a circuit for a differential amplifier used in FIG. 4.
Figure 6:
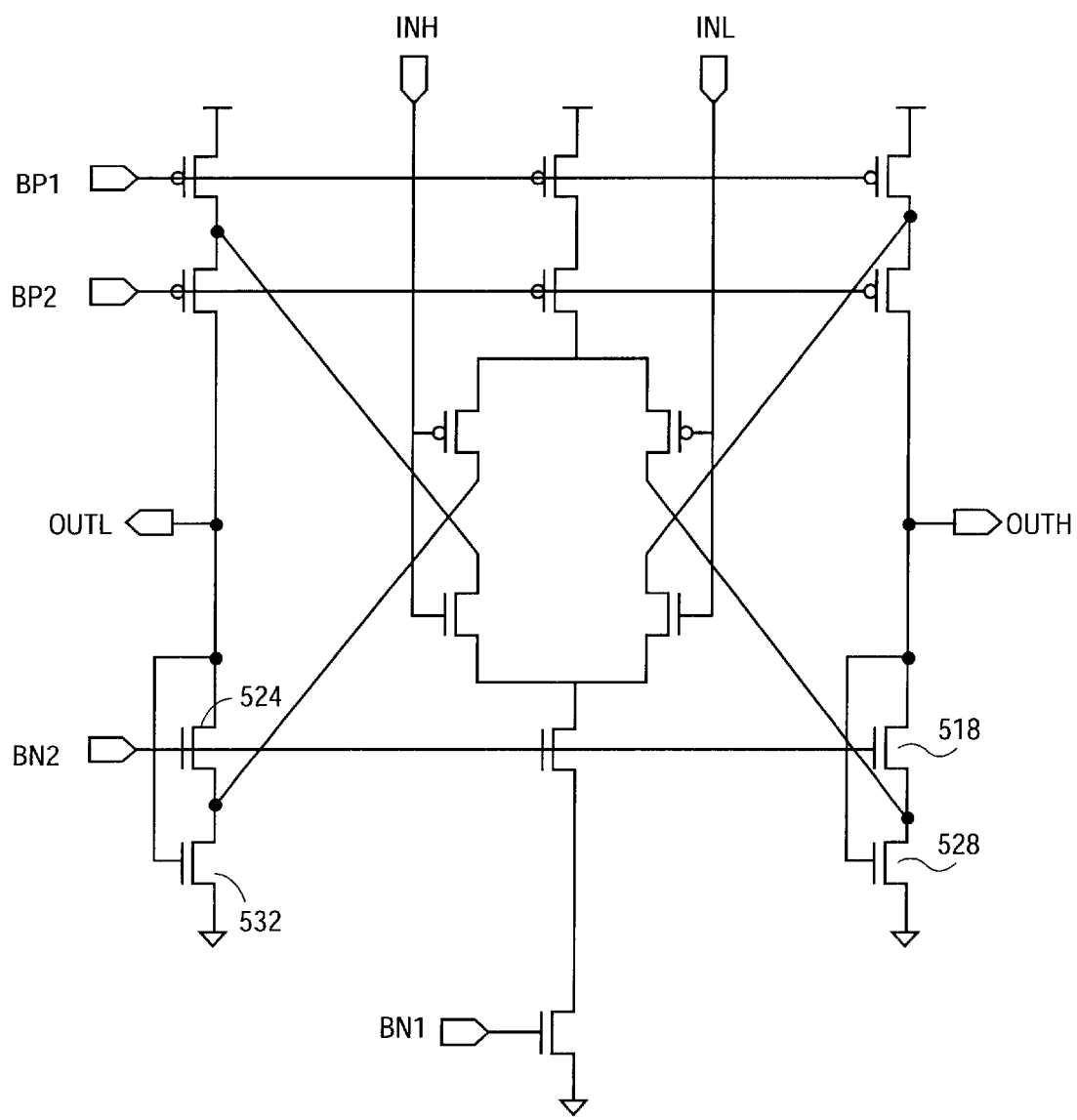
FIG. 6 is a circuit for a differential amplifier used in FIG. 4.

An embodiment of the present invention is illustrated in FIGS. 4, 5, and 6. The received differential signal to be envelope detected is the pair of voltage signals $V_{IN1}$ and $V_{IN2}$. The envelope is provided as an output differential signal, denoted by the pair of voltage signals $V_{OUTP}$ and $V_{OUTN}$. The difference $|V_{OUTP}-V_{OUTN}|$ is the detected envelope.

In FIG. 4, differential amplifiers 402 and 404 are identical building block circuits, each having input ports INH and INL. For either differential amplifier 402 or 404, the idealized input-output relationship is:

$$V_{OUTH}=G[V_{INH}-V_{INL}]+V_{COM}, \quad (1)$$

and $$V_{OUTL}=G[V_{INH}-V_{INL}]+V_{COM}, \quad (2)$$

where $V_{INH}$ and $V_{INL}$ denote the input voltages at input ports INF and INL, respectively, $V_{OUTH}$ and $V_{OUTL}$ denote the output voltages at output ports OUTH and OUTL, respectively, $V_{COM}$ is the common mode voltage, and G>>1 is the amplifier voltage gain. A nominal value for $V_{COM}$ is $V_{COM}=V_{CC}/2$, where $V_{cc}$ is the supply voltage.

When the differential input voltage signal is zero, e.g., $V_{IN1}-V_{IN2}=0$ for the case of no received signal, the output voltages $V_{OUTH}$ and $V_{OUTL}$ are at the common mode voltage $V_{COM}$. For the nominal case in which the differential input voltage signal is zero and the common mode voltage is $V_{COM}=V_{CC}/2$, and assuming that the betas for transistors 412, 416, 426, and 428 are equal to each other, the output voltage $V_{OUTP}$ will be above $V_{CC}/2$ and the output voltage $V_{OUTN}$ will be below $V_{CC}/2$ by the same amount. This amount depends upon the drain-source currents of transistors 412, 416, 426, and 428, and the resistance values of resistors 430 and 432. These variables may be chosen so that for the nominal case with no signal present, capacitors 422 and 424 are approximately at $V_{CC}/2$ so that the differential output signal is approximately zero, i.e., $(V_{OUTP}-V_{OUTN})=0$. If the differential output signal is not zero in the nominal case with no signal present, then the threshold may be accordingly adjusted so that false alarms are at an acceptable level.

The resistor network comprising resistors 406 and 408 provides a linear combination of the received voltage signal $V_{IN1}$, and the output voltage signal $V_{OUTP}$ to the port INH of differential amplifier 402. The small-signal voltage at node 410 is opposite in sign to the small-signal voltage at output port OUTH of differential amplifier 402, so that coupling node 410 to the INH port of differential amplifier 402 via resistor 408 provides negative feedback. Denoting the resistances of resistors 406 and 408 by, respectively, $r_1$ and $r_2$, the small-signal voltage at output port OUTH by $v_{OUTH}$, and the small-signal voltage of $V_{IN1}$ by $V_{IN1}$ the small-signal voltage at input port INH, denoted by $V_{INH}$, is $$v_{INH} = \frac{1}{r_1 + r_2}[r_2 v_{IN1} - r_1 v_{OUTH}]. \quad (3)$$

Similarly, the small-signal voltage at node 414 is opposite in sign to the small-signal voltage at the output port OUTL of differential amplifier 402, so that coupling node 414 to the input port INL of differential amplifier 402 via resistor 418 provides negative feedback. The resistor network comprising resistors 418 and 420 provides a linear combination of the received voltage signal $V_{IN2}$ and the output voltage signal $V_{OUTN}$ to the input port INL of differential amplifier 402. Using similar notation for small-signal voltages as was done previously, and if the resistances of resistors 420 and 418 are again, respectively, equal to $r_1$ and $r_2$ (it is only necessary that their ratio be $r_1/r_2$) then the small-signal voltage at the input port INL of differential amplifier 402 is $$v_{INL} = \frac{1}{r_1 + r_2}[r_2 v_{IN2} - r_1 v_{OUTL}]. \quad (4)$$

Applying the input-output relationships of equations (1) and (2) with the small-signal voltages in equations (3) and (4), it follows that $$v_{OUTH} = \frac{Gr_2}{r_1 + r_2}[v_{IN1} - v_{IN2}] + \frac{Gr_1}{r_1 + r_2}[v_{OUTL} - v_{OUTH}], \quad (5)$$

and $$v_{OUTL} = -v_{OUTH}. \quad (6)$$

It follows from equations (5) and (6) with G>>1 that $$v_{OUTH} = \frac{r_2}{2r_1}[v_{IN1} - v_{IN2}], \text{ and} \quad (7)$$

$$v_{OUTL} = -\frac{r_2}{2r_1}[v_{IN1} - v_{IN2}]. \quad (8)$$

Consider the case in which capacitors 422 and 424 have been charged to their nominal voltage potentials (the steady-state voltage potentials when $V_{IN1}-V_{IN2}=0$). From equations (7) and (8), it is seen that during negative excursions of the voltage difference $v_{IN1}-v_{IN2}$, pMOSFET 412 sources small-signal current to capacitor 422 and nMOSFET 416 sinks small-signal current from capacitor 424, so that the absolute value of the potential voltage difference between capacitors 422 and 424 increases according to the envelope of $|v_{IN1}-v_{IN2}|$. Thus, the arrangement of differential amplifier 402, resistor network 408 and 406, resistor network 418 and 420, and capacitors 422 and 424 provides half-wave rectification.

The arrangement of differential amplifier 404, resistor network 434 and 436, resistor network 438 and 440, and capacitors 422 and 424 also provides half-wave rectification. If resistors 434 and 438 each have resistance $r_1$, and if resistors 436 and 440 each have resistance $r_2$ (it is only necessary that their ratios be $r_1/r_2$), then because the input port INH of differential amplifier 404 is coupled to $V_{IN2}$ and the input port INL of differential amplifier 404 is coupled to $V_{IN1}$, the small-signal output voltages at ports OUTH and OUTL of differential amplifier 404 are given by $$v_{OUTH} = -\frac{r_2}{2r_1}[v_{IN1} - v_{IN2}], \text{ and} \quad (9)$$

$$v_{OUTL} = \frac{r_2}{2r_1}[v_{IN1} - v_{IN2}]. \quad (10)$$

Again, assuming that capacitors 422 and 424 have already been charged to their nominal voltage potentials, from equations (9) and (10) it is seen that during positive excursions of the voltage difference $v_{IN1}-V_{IN2}$, pullup pMOSFET 426 sources small-signal current to capacitor 422 and pull-down nMOSFET 428 sinks small-signal current from capacitor 424, so that the absolute value of the potential voltage difference between capacitors 422 and 424 increases according to the envelope of $|v_{IN1}-v_{IN2}|$.

Consequently, transistors 412, 416, 426, and 428 provide full-wave rectification, and because of the filtering function of capacitors 422 and 424, the difference voltage $|V_{OUTP}-V_{OUTN}|$ is approximately given by $$|V_{OUTP} - V_{OUTN}| = \frac{r_2}{r_1}\text{env}|v_{IN1} - v_{IN2}| = \frac{r_2}{r_1}\text{env}|V_{IN1} - V_{IN2}|, \quad (11)$$

where env(·) denotes the envelope function.

The above expression in equation (11) assumed that the difference in voltage between capacitors 422 and 424 is approximately zero for the case in which $V_{IN1}=V_{IN2}$. That is, for the nominal case, capacitors 422 and 424 charge to the same potential when there is no signal present. If this assumption is not valid, then equation (11) takes the form $$|V_{OUTP} - V_{OUTN}| = \frac{r_2}{r_1}\text{env}|V_{IN1} - V_{IN2}| + V_0,$$

for some voltage $V_0$ substantially independent of the received differential signal. In either case, the difference $|V_{OUTP}-V_{OUTN}|$ is nevertheless indicative of the envelope of $|V_{IN1}-V_{IN2}|$. As discussed earlier, the A/D slice threshold may be adjusted to take into account the voltage $V_0$ so that false alarms are at an acceptable level. This may be performed during an initialization procedure.

Capacitors 422 and 424 discharge through resistors 430 and 432 so that when no received signal is present, their voltage potentials reach their nominal values. Resistors 430 and 432 are tapped at node 442 to provide a feedback voltage ENV_COM to input port INL of differential amplifier 444. In the particular embodiment of FIG. 4, differential amplifiers 402 and 404 each have an input port BN_CM for controlling their common mode voltages. A reference voltage $V_{COMREF}$ is applied to the input port INH of differential amplifier 444, and may be chosen as $V_{COMREF}=V_{CC}/2$. The output of differential amplifier 444 is applied to the BN_CM input ports of differential amplifiers 402 and 404. This negative feedback arrangement forces the voltage ENV_COM to follow $V_{COMREF}$, so that the common mode voltage may be controlled in a stable fashion.

A circuit diagram for differential amplifiers 402 and 404 is provided in FIG. 5. Input ports INH and INL are connected to a pMOSFET differential pair comprising pMOSFETs 502 and 504 and a nMOSFET differential pair comprising nMOSFETs 506 and 508 as shown in FIG. 5. pMOSFETs 510 and 512 source bias current to the pMOSFET differential pair, and nMOSFETs 514 and 516 sink bias current from the nMOSFET differential pair. nMOSFET 518 and pMOSFET 504 form a folded cascade pair, where nMOSFET 518 provides impedance translation so as to contribute to a high amplifier output impedance. Similarly, nMOSFET 508 and pMOSFET 520; nMOSFET 506 and pMOSFET 522; and pMOSFET 502 and nMOSFET 524 form folded cascade pairs, where pMOSFET 520, pMOSFET 522, and nMOSFET 524 provide impedance translation to contribute to a high amplifier output impedance. Having a high output impedance increases amplifier gain.

pMOSFET 526 sources bias current to pMOSFET 520 and nMOSFET 508; nMOSFET 528 sinks bias current from nMOSFET 518 and pMOSFET 504; pMOSFET 530 sources bias current to pMOSFET 522 and nMOSFET 506; and nMOSFET 532 sinks bias current from pMOSFET 502 and nMOSFET 524. pMOSFETs 510, 526, and 530 are biased by a bias voltage applied to port BP1, and pMOSFETs 512, 520, and 522 are biased by a bias voltage applied to port BP2. nMOSFETs 514, 518, and 524 are biased by a bias voltage applied to port BN2, and nMOSFET 516 is biased by bias voltage applied to port BN1. nMOSFETs 528 and 532 are biased by a bias voltage applied to port BN_CM. The port BN_CM is used to control the common mode voltage.

A circuit diagram for differential amplifier 444 is shown in FIG. 6. The circuit of FIG. 6 is similar to that of FIG. 5, except that nMOSFETs 528 and 532 are now biased by connecting their gates to the drains of nMOSFETs 518 and 524, respectively.

Many other embodiments may be implemented. For example, a single floating capacitor may be used in place of capacitors 422 and 424, where one terminal of the floating capacitor is connected to node 410 and the other terminal is connected to node 414. Alternatively, the terminal of capacitor 422 that is connected to the substrate may instead be connected to the supply voltage, and similarly the terminal of capacitor 424 connected to the substrate may instead be connected to the supply voltage. In such an arrangement, the capacitors would be discharging instead of charging when envelope detection is performed on a received signal. In either case, the difference in voltages at nodes 410 and 414 is indicative of to the envelope of the difference between the received voltage signals $v_{IN1}$ and $v_{IN2}$. However, it is easier to fabricate MOSFET capacitors in which one terminal is at ground (substrate) potential, so that the configuration of capacitors 422 and 424 as shown in FIG. 4 is the more likely embodiment.

Figure 7:
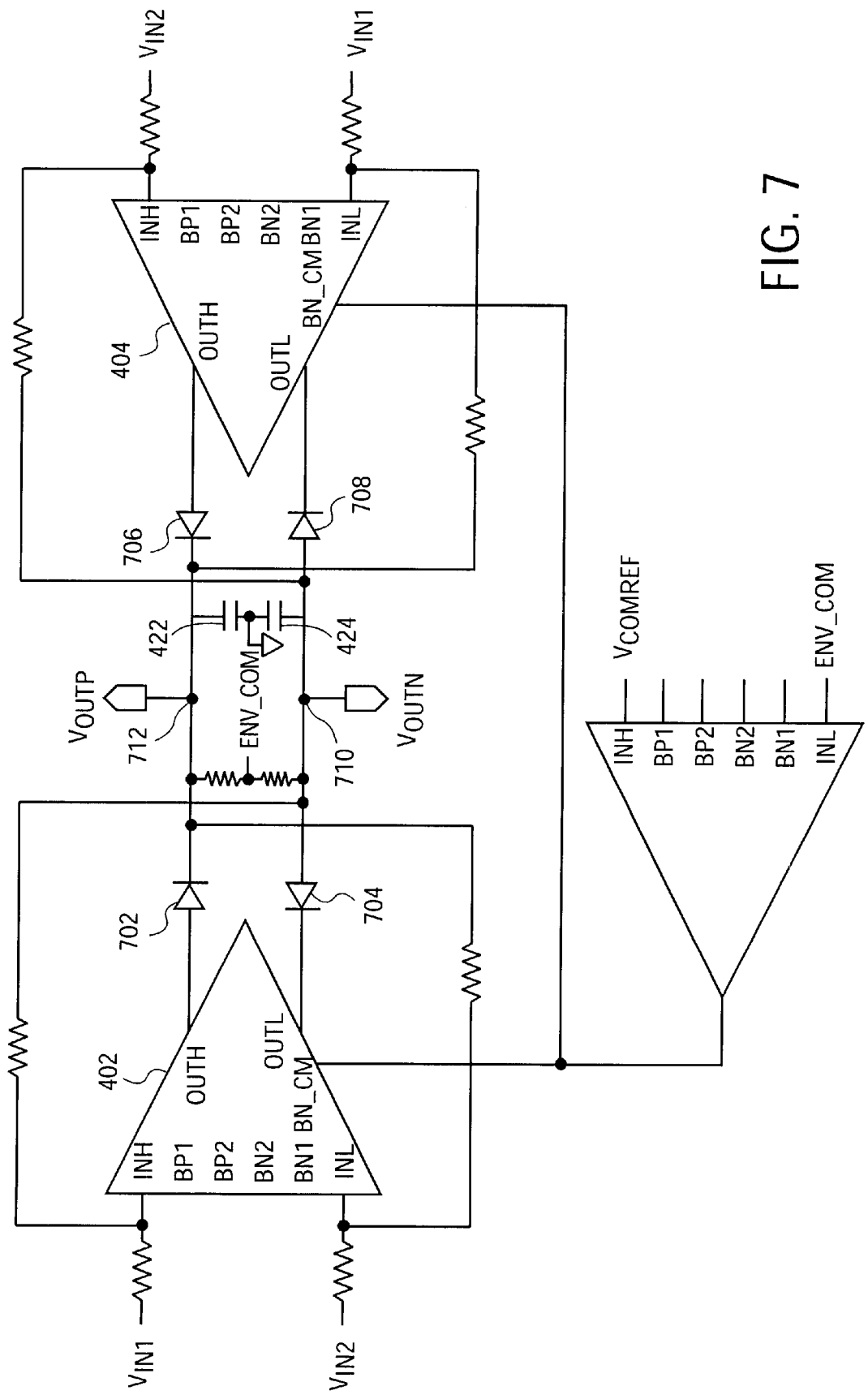
FIG. 7 is a circuit according to another embodiment of the present invention.

As another example, an embodiment is illustrated in FIG. 7 employing diodes (or rectifiers) 702, 704, 706, and 708 to provide rectification. To provide negative feedback in FIG. 7, node 710 is coupled to the INH ports of differential amplifiers 402 and 404, and node 712 is coupled to the INL ports of differential amplifiers 402 and 404. When capacitors 422 and 424 are charged to their nominal values, diodes 702 and 704, will be forward-biased to source and sink small-signal current to and from capacitors 422 and 424, respectively, for positive excursions of $v_{IN1}-v_{IN2}$, and diodes 706 and 708 will be forward-biased to source and sink small-signal current to and from capacitors 422 and 424, respectively, for negative excursions of $v_{IN1}-v_{IN2}$.

It is to be appreciated that the embodiment of FIG. 4 may employ different circuits for differential amplifiers 402, 404, and 444 than that shown in FIGS. 5 and 6. Also, only half-wave rectification may be employed by eliminating differential amplifier 404, pullup pMOSFET 426, and pulldown nMOSFET 428. Clearly, various modifications may be made to the above-described embodiments without departing from the scope of the invention as claimed below.

What is claimed is:

1. A differential envelope detector to provide envelope detection of a differential signal pair comprising a first input voltage signal and a second input voltage signal, the differential envelope detector comprising:

a first capacitor having a node at a first output voltage;

a second capacitor having a node at a second output voltage; and a differential amplifier comprising
a first input port to be coupled to the first input voltage signal;
a second input port to be coupled to the second input voltage signal;
a first output port having a first output port voltage; and
a second output port having a second output port voltage;

wherein the output ports are coupled to the input ports in such a way as to provide negative feedback;

a first device to only source, in response to the first output port voltage, small-signal current to the first capacitor; and a second device to only sink, in response to the second output port voltage, small-signal current from the second capacitor so that the difference of the first and second output voltages is indicative of the envelope of the difference of the first and second input voltage signals.

2. The differential envelope detector as set forth in claim 1, wherein the first and second capacitors are the same capacitor.

3. The differential envelope detector as set forth in claim 1, wherein the first device comprises:

a pMOSFET having a gate coupled to the first output port, and having a drain coupled to the first capacitor to only source small-signal current to the first capacitor and coupled to the first input port to provide negative feedback; and wherein the second device comprises:

a nMOSFET having a gate coupled to the second output port, and having a drain coupled to the second capacitor to only sink small-signal current from the second capacitor and coupled to the second input port to provide negative feedback.

4. The differential envelope detector as set forth in claim 1, wherein the first device comprises:

a first rectifier having an anode coupled to the first output port, and having a cathode coupled to the first capacitor to source small-signal current to the first capacitor and coupled to the second input port to provide negative feedback; and wherein the second device comprises:
  a second rectifier having a cathode coupled to the second output port, and having an anode coupled to the second capacitor to sink small-signal current from the second capacitor and coupled to the first input port to provide negative feedback.

5. The differential envelope detector as set forth in claim 1, wherein the first differential amplifier comprises:
  a pMOSFET differential pair comprising first and second pMOSFETs; and
  a nMOSFET differential pair comprising first and second nMOSFETs;
  wherein the gates of the first pMOSFET and the first nMOSFET are connected to the first input port;
  wherein the gates of the second pMOSFET and the second nMOSFET are connected to the second input port.

6. A differential envelope detector comprising:
  a first input port to receive a small-signal voltage $v_{IN1}$;
  a second input port to receive a small-signal voltage $v_{IN2}$;
  a differential amplifier comprising
    a first input port having a small-signal voltage $v_{INH}$;
    a second input port having a small-signal voltage $v_{INL}$;
    a first output port having a small-signal voltage $v_{OUTH}$; and
    a second output port having a small-signal voltage $v_{OUTL}$;
    wherein the differential amplifier has an input-output relationship substantially given by $v_{OUTH}=G(v_{INH}-v_{INL})$ and $v_{OUTL}=-v_{OUTH}$;
  a first node having a small-signal voltage $v_{OUTP}$;
  a second node having a small-signal voltage $v_{OUTN}$;
  a first capacitor connected to the first node; and
  a second capacitor connected to the second node;
  wherein the first and second output ports are coupled to the first and second input ports of the differential amplifier to provide negative feedback, the first output port is coupled to the first node to only source small-signal current to the first capacitor, and the second output port is coupled to the second node to only sink small-signal current from the second capacitor so that the difference $|v_{OUTP}-v_{OUTN}|$ is indicative of the envelope of the difference $|v_{IN1}-v_{IN2}|$.

7. The differential envelope detector as set forth in claim 6, first and second capacitors are the same capacitor.

8. A differential envelope detector comprising:
  a first input port;
  a second input port;
  a differential amplifier comprising
    a first input port having a small-signal voltage $v_{INH}$;
    a second input port having a small-signal voltage $v_{INL}$;
    a first output port having a small-signal voltage $v_{OUTH}$; and
    a second output port having a small-signal voltage $v_{OUTL}$;
    wherein the differential amplifier has an input-output relationship substantially given by $v_{OUTH}=G(v_{INH}-v_{INL})$ and $v_{OUTL}=-v_{OUTH}$;
  a first node;
  a second node;
  a first capacitor connected to the first node;
  a second capacitor connected to the second node;
  a pMOSFET having a gate coupled to the first output port to be responsive to $v_{OUTH}$ and having a drain coupled to the first node to source small-signal current to the first capacitor;
  a nMOSFET having a gate coupled to the second output port to be responsive to $v_{OUTL}$ and having a drain coupled to the second node to sink small-signal current from the second capacitor;
  a first resistor network comprising
    a first resistor coupling the first node to the first input port of the differential amplifier to provide negative feedback; and
    a second resistor coupling the first input port of the differential amplifier to the first input port of the differential envelope detector; and
  a second resistor network comprising
    a first resistor coupling the second node to the second input port of the differential amplifier to provide negative feedback; and
    a second resistor coupling the second input port of the differential amplifier to the second input port of the differential envelope detector.

9. The envelope detector as set forth in claim 8, wherein the first and second capacitors are the same capacitor.

10. A differential envelope detector comprising:
  a first input port;
  a second input port;
  a differential amplifier comprising
    a first input port having a small-signal voltage $v_{INH}$;
    a second input port having a small-signal voltage $v_{INL}$;
    a first output port having a small-signal voltage $v_{OUTH}$; and
    a second output port having a small-signal voltage $v_{OUTL}$;
    wherein the differential amplifier has an input-output relationship substantially given by $v_{OUTH}=G(v_{INH}-v_{INL})$ and $v_{OUTL}=-v_{OUTH}$;
  a first node;
  a second node;
  a first capacitor connected to the first node;
  a second capacitor connected to the second node;
  a first rectifier having an anode coupled to the first output port to be responsive to $v_{OUTH}$ and having a cathode coupled to the first node to source small-signal current to the first capacitor;
  a second rectifier having an cathode coupled to the second output port to be responsive to $v_{OUTL}$ and having a anode coupled to the second node to sink small-signal current from the second capacitor;
  a first resistor network comprising
    a first resistor coupling the second node to the first input port of the differential amplifier to provide negative feedback; and
    a second resistor coupling the first input port of the differential amplifier to the first input port of the differential envelope detector; and
  a second resistor network comprising
    a first resistor coupling the first node to the second input port of the differential amplifier to provide negative feedback; and
    a second resistor coupling the second input port of the differential amplifier to the second input port of the differential envelope detector.

11. The differential envelope detector as set forth in claim 10, where the first and second capacitors are the same capacitor.

12. A communication system employing differential signaling, the communication system comprising:

a network to propagate a differential signal comprising a small-signal voltage $v_{IN1}$ and a small-signal voltage $v_{IN2}$; and a differential envelope detector comprising
- a first input port to receive the small-signal voltage $v_{IN1}$;
- a second input port to receive the small-signal voltage $v_{IN2}$;
- a differential amplifier comprising
  - a first input port having a small-signal voltage $v_{INH}$;
  - a second input port having a small-signal voltage $v_{INL}$;
  - a first output port having a small-signal voltage $v_{OUTH}$; and
  - a second output port having a small-signal voltage $v_{OUTL}$;
  - wherein the differential amplifier has an input-output relationship substantially given by $v_{OUTH}=G(v_{INH}-v_{INL})$ and $v_{OUTL}=-v_{OUTH}$;
- a first node having a small-signal voltage $v_{OUTP}$;
- a second node having a small-signal voltage $v_{OUTN}$;
- a first capacitor connected to the first node; and
- a second capacitor connected to the second node;
- wherein the output ports are coupled to the input ports of the differential amplifier in such a way as to provide negative feedback, the first output port is coupled to the first node to only source small-signal current to the first capacitor, and the second output port is coupled to the second node to only sink small-signal current from the second capacitor so that the difference $|v_{OUTP}-v_{OUTN}|$ is indicative of the envelope of the difference $|v_{IN1}-v_{IN2}|$.

13. The communication system as set forth in claim 12, wherein the first and second capacitors are the same capacitor.

* * * * *

UNITED STATES PATENT AND TRADEMARK OFFICE
CERTIFICATE OF CORRECTION

PATENT NO. : 6,566,915 B1
DATED : May 20, 2003
INVENTOR(S) : Krupnik et al.

It is certified that error appears in the above-identified patent and that said Letters Patent is hereby corrected as shown below:

Column 2,
Line 50, delete "$V_{OUTL} = G[V_{INH} - V_{INL}] + V_{COM}$,", insert -- $V_{OUTL} = -G[V_{INH} - V_{INL}] + V_{COM}$, --.
Line 53, delete "INF", insert -- INH --.

Column 5,
Lines 16 and 21, delete "cascade", insert -- cascode --.

Signed and Sealed this

Twenty-fifth Day of November, 2003

JAMES E. ROGAN
*Director of the United States Patent and Trademark Office*